US010449635B2

(12) United States Patent
Bayram et al.

(10) Patent No.: US 10,449,635 B2
(45) Date of Patent: Oct. 22, 2019

(54) METHOD AND APPARATUS FOR THROUGH-CUT DETECTION IN THE THERMALLY ASSISTED THROUGH-CUTTING OF A WORKPIECE

(71) Applicant: Messer Cutting Systems GmbH, Gross-Umstadt (DE)

(72) Inventors: Murat Cetin Bayram, Gross-Umstadt (DE); Thomas Müller, Gross-Umstadt (DE)

(73) Assignee: Messer Cutting Systems GmbH, Gross-Umstadt (DE)

( * ) Notice: Subject to any disclaimer, the term of this patent is extended or adjusted under 35 U.S.C. 154(b) by 231 days.

(21) Appl. No.: 15/458,417

(22) Filed: Mar. 14, 2017

(65) Prior Publication Data

US 2017/0274477 A1 Sep. 28, 2017

(30) Foreign Application Priority Data

Mar. 24, 2016 (DE) ........................ 10 2016 105 560

(51) Int. Cl.

*B23K 26/38* (2014.01)
*B23K 26/382* (2014.01)
*B23K 26/04* (2014.01)
*B23K 26/40* (2014.01)
*B23K 26/0622* (2014.01)

(Continued)

(52) U.S. Cl.

CPC .............. *B23K 26/38* (2013.01); *B23K 7/002* (2013.01); *B23K 26/0342* (2015.10); *B23K 26/048* (2013.01); *B23K 26/0622* (2015.10); *B23K 26/082* (2015.10); *B23K 26/382* (2015.10); *B23K 26/40* (2013.01); *G01R 25/005* (2013.01); *B23K 2103/05* (2018.08); *B23K 2103/10* (2018.08); *B23K 2103/12* (2018.08)

(58) Field of Classification Search

CPC .............................. B23K 26/38; B23K 26/082
USPC ........................................................ 266/48
See application file for complete search history.

(56) References Cited

U.S. PATENT DOCUMENTS 5,225,658 A * 7/1993 Yamaguchi .............. B23K 9/06 219/121.39
2017/0274477 A1* 9/2017 Bayram ............... B23K 26/082

FOREIGN PATENT DOCUMENTS

DE 102010039525 A1 2/2012

OTHER PUBLICATIONS

Espacenet English language Absrtact for DE 1020 100 39525 A1, published Feb. 23, 2012.

* cited by examiner

*Primary Examiner* — Scott R Kastler
(74) *Attorney, Agent, or Firm* — Tiajoloff & Kelly LLP

(57) ABSTRACT

In known methods for through-cut detection in the thermally assisted through cutting of a workpiece, the workpiece is subjected to a first alternating signal. A method that allows a fast and accurate detection of a through-cut made comprises the method steps of detecting a second alternating electrical signal caused by the first alternating electrical signal in a measurement electrode spaced from the workpiece, determining the phase shift between the first and second alternating electrical signals to output a phase shift signal, and detecting a temporal evolution of the phase shift electrical signal or a measurement variable derived therefrom in a predetermined time interval. When a workpiece through-cut is made, it is detected in that the phase shift (Continued)

20
202
250
201
209
207
A
208
200 signal or the measurement variable derived therefrom is in the time interval within a predetermined fluctuation range.

16 Claims, 8 Drawing Sheets

(51) Int. Cl.

| | |
|---|---|
| ***B23K 26/03*** | (2006.01) |
| ***B23K 26/082*** | (2014.01) |
| ***B23K 7/00*** | (2006.01) |
| ***G01R 25/00*** | (2006.01) |
| *B23K 103/04* | (2006.01) |
| *B23K 103/10* | (2006.01) |
| *B23K 103/12* | (2006.01) |

METHOD AND APPARATUS FOR THROUGH-CUT DETECTION IN THE THERMALLY ASSISTED THROUGH-CUTTING OF A WORKPIECE

BACKGROUND OF THE INVENTION

Field of the Invention

The present invention refers to a method for through-cut detection in the thermally assisted through-cutting of a workpiece in which the workpiece is subjected to a first alternating electrical signal.

Furthermore, the present invention refers to an apparatus for through-cut detection in the thermally assisted through-cutting of a workpiece, comprising an alternating electrical signal generator for generating a first alternating signal.

Description of Prior Art

The thermal cutting of workpieces is normally carried out by the combined use of a focused laser beam and a gas jet. Depending on the separation mechanism, a distinction is made between laser-beam fusion cutting, laser-beam evaporation cutting or laser flame cutting. Laser-beam fusion cutting is widely used. Material separation is here carried out by fusing the material by way of the heating power of the laser beam in the area of the cutting front and by expulsion by way of simultaneous pulse transmission of the cutting gas jet out of the kerf. High-performance lasers, particularly $CO_2$, fiber, disk and diode lasers, are used, wherein predominantly circularly polarized or unpolarized laser radiation is used to avoid directional dependence in the absorption behavior in contour cuts.

In the piercing or through-cutting process a first hole is formed in the workpiece. Here, laser radiation is normally used only in pulsed operation to pierce the material as fast as possible, but at the same time as gently as possible. The detection of the through-cut made poses problems. In the case of a manually programmed piercing operation the piercing parameters, including the typical piercing duration, are stored in a database for each specific constellation of workpiece type and thickness. However, due to unforeseeable material deviations and changes in the process the piercing duration must be provided with a temporal safety buffer. The safety buffer is to ensure that in the production process the time between the beginning of the piercing operation and the cutting operation is not chosen too short and that no waste is produced. However, if the time is too long, the total time required for processing is unnecessarily prolonged and despite the fact that the piercing process is actually completed, further process energy is introduced into the workpiece. This energy can change the properties of the material and makes it difficult to maintain a constant cutting quality in a reproducible manner.

Devices for automatically detecting the through-cut made avoid this drawback. These devices comprise, for instance, an optical sensor which senses the backscattered light during the piercing operation and interprets a change in the backscatter light above a threshold value as the completion of the piercing process. The use of optical sensors requires, however, a certain installation space. Moreover, the sensors are arranged either near the workpiece, so that under separation conditions they are exposed to high thermal stresses, or they are arranged at a distance from the separation process, which results in an unfavorable signal/noise ratio, so that the electrical signal of the sensor must normally be amplified.

Furthermore, optical sensors have the drawback that there are factors in the optical path that change the sensor signal, for instance the nozzle diameter.

Another approach is made in DE 10 2010 039 525 A1, which discloses a method and an apparatus for through-cut detection according to the above-mentioned type. For the automatic detection of the through cut a capacitive distance sensor is used, as is also employed during the cutting process for contactless distance measurement, thereby ensuring a distance between laser nozzle and upper side of the workpiece. In the capacitive distance measurement system the metallic distance sensor and the metallic workpiece form a variable capacitor which is integrated in an LC resonant circuit. If a first alternating electrical signal is applied to the workpiece, the capacitance of said capacitor is determined through the distance between sensor and workpiece. When traveling over the workpiece in the area of the aperture, the distance sensor will detect due to the sudden change in distance that a through cut has been formed in the workpiece.

SUMMARY OF THE INVENTION

In this method, through-cut detection depends substantially on the detection of the increase in amplitude in the LC generator output signal. The amplitude level depends however on a plurality of factors, for instance on the resistances prevailing in the resonant circuit and the size of the interspace, but particularly on the distance between workpiece and sensor (which is also called "measurement electrode" in the following).

The LC generator output electrical signal often shows background noise. This situation is aggravated by the fact that during piercing a plasma capsule of charged particles is formed on the upper side of the workpiece. The formation of the plasma is detrimental to the capacitance between measurement electrode and upper side of the workpiece, which leads to a fluctuating voltage signal. Another reason for this are detached material parts which are ejected from the incision crater towards the measurement electrode.

This complicates an exact, particularly early detection of the through cut.

It is therefore the object of the invention to indicate a method which allows an early detection of the imminent through-cut or the through-cut made.

Furthermore, it is the object of the invention to provide an apparatus for performing the method.

As for the method, the above-mentioned object is achieved according to the invention by a method comprising the following method steps:

a) detecting a second alternating electrical signal caused by the first alternating electrical signal in a measurement electrode spaced from the workpiece, b) determining the phase shift between first and second alternating electrical signal with output of a phase shift signal, and c) detecting a temporal evolution of the phase shift signal or a measurement variable derived therefrom in a predetermined time interval, wherein a workpiece through-cut made is detected in that the phase shift signal or the measurement variable derived therefrom is in the time interval within a predetermined fluctuation range.

The invention is based on the idea to detect a through cut as early as possible, preferably still in its creation process. In contrast to known methods with an LC resonant circuit an evaluation of the amplitude signal is omitted. Instead of this, according to the invention a differential measurement method is employed for through-cut detection, wherein two signal s are used and their phase shift relative to each other is determined, namely a measurement signal which is output by a measurement electrode and a reference signal on which the measurement signal of the measurement electrode is based. By comparison of the phase of measurement signal and reference signal the phase shift signal is produced. This is a corrected evaluation signal in which measurement errors are eliminated, and which has a particularly good signal/noise ratio.

For this purpose the workpiece is first acted upon with a signal changing in time (first alternating signal). Preferably, the first alternating electrical signal is an alternating voltage signal $U_1$ (t). In an electrode arranged at a distance from the workpiece, the first alternating electrical signal produces a second alternating signal, for instance an alternating current signal $I_{1,\varphi}$ (t), which is used as a measurement signal, and which by comparison with the first alternating signal (reference signal) has a phase shift. To be able to detect the phase shift as exactly as possible, the first alternating electrical signal is used as a reference signal. The phase shift is determined by a comparison of the first alternating electrical signal with the second alternating signal.

It has been found that the phase shift signal depends on the capacitance formed between measurement electrode and the workpiece. With an increasing distance of the measurement electrode from the workpiece the amount of the phase shift signal is increasing. At a constant distance of measurement electrode and workpiece the capacitance is predominantly determined by the dielectric constant of the dielectric.

Due to the plasma capsule formed in the space between measurement electrode and workpiece prior to the through cut, the composition of the dielectric is permanently changing and thus that of measurement electrode and thus the phase shift signal. When the plasma capsule disappears, the composition of the dielectric no longer changes and the phase shift signal is constant. If the phase shift signal is within a predetermined time interval within a predetermined fluctuation range, this serves as an indicator of the through-cut made.

It has here turned out to be useful when the first alternating electrical signal which serves as a reference signal is first inverted for the determination of the phase shift, the amplitudes of first and second alternating electrical signal are matched to each other and adjusted, and the first and the second alternating electrical signal are subsequently added. In this case, if there is no phase shift, first and second alternating signal s neutralize each other. However, if there is a phase shift, a phase shift signal is obtained, the level and direction of which depend on the phase shift. The phase shift signal changes upon a change in distance between measurement electrode and workpiece and upon a change of the dielectric by plasma formation in the interspace.

To avoid a distortion of the phase shift signal by distance changes, the measurement electrode during the thermally assisted through cut is preferably kept at a constant work distance from the workpiece.

Advantageously, prior to the thermal through-cut with the measurement electrode held at work distance, an initial phase-shift signal value is determined, wherein the predetermined fluctuation range comprises the initial phase-shift signal value.

The initial phase-shift signal value is preferably determined before the laser beam acts on the workpiece.

It is within the predetermined fluctuation range, namely ideally in the middle thereof. Thus, a procedure is preferred in which the predetermined fluctuation range has a mean value corresponding to the initial phase-shift signal value, wherein the predetermined fluctuation range is in a range of ±5% to ±15% based on the mean value.

It has turned out to be useful when according to method step c) the variance of the phase shift signal in the predetermined time interval is detected as a derived measurement variable.

However, with respect to particularly low noise and high measuring accuracy it has turned out to be particularly advantageous when according to method step c) the first time derivative of the phase shift signal is detected in the predetermined time interval and used as a derived measurement variable.

Moreover, it is also possible with the help of the invention to detect an imminent through-cut that has not been carried out yet, and to react to it, if necessary. This possibility is based on the fact that the plasma capsule in the course of the through-cutting process and increasing material fusion in the incision crater can disappear fully or in part. The influence of the plasma capsule on the phase shift signal thereby changes, which signal thereby shifts to noticeably higher or lower voltages. This phenomenon is particularly noticeable in workpieces with rather great material thicknesses, normally at material thicknesses above 10 mm. It depends on the workpiece thickness and the type of material whether the shift takes place towards higher or lower voltages.

In this respect it is intended in a particularly preferred procedure that in the thermally assisted through-cutting of the workpiece by way of a treatment unit an energy input takes place into an incision crater, and that the through-cutting operation is monitored such that when the temporal evolution detected according to method step c) in the predetermined time interval exceeds a predetermined maximum fluctuation range or when in the temporal evolution according to method step c) a peak value is detected above a predetermined peak maximum value, the energy input into the incision crater is changed.

The energy input into the incision crater in the case of an imminent through-cut is reduced or increased in this process. If it is reduced, the workpiece is treated with care and a clean through-cut is obtained. If it is increased, the through-cutting operation is accelerated.

The energy input into the incision crater can be changed by reducing or increasing the distance of treatment unit and workpiece. This measure, however, also changes the phase shift signal, so that the change of the energy input preferably takes place via other measures.

In the event that the treatment unit comprises a laser, it has for instance turned out to be useful when the energy input into the incision crater is changed by changing focal position, pulse frequency, power and/or duty cycle of the laser.

By contrast, if the treatment unit comprises a cutting torch, the energy input into the incision crater can also be changed by increasing or decreasing a gas pressure, preferably a cutting gas pressure.

The introduction of the phase with reduced energy input into the incision crater may lead to an operator message to indicate the changed conditions to the operating personnel optically or acoustically, so that in case of a misinterpretation a manual intervention is possible.

As for the apparatus for through-cut detection in the case of a thermally assisted through-cutting of a workpiece, the above-mentioned object is achieved according to the invention by a modification of the apparatus of the above-mentioned type, which comprises a measurement electrode spaced from the workpiece for detecting a second alternating electrical signal caused by the first alternating signal, a phase discriminator for determining a phase shift between the first and the second alternating signal, which discriminator outputs a phase shift signal, and wherein an electronic circuit is provided for detecting a temporal evolution of the phase shift signal or a measurement variable derived therefrom and is designed such that a workpiece through-cut is identified if the phase shift signal or the measurement variable derived therefrom is in a predetermined time interval within a predetermined fluctuation range.

The apparatus allows an early detection of the imminent through-cut or the through-cut made. To this end an alternating electrical signal generator is provided that is suited to produce a first alternating electrical signal which can be applied to the workpiece. Preferably, the first alternating electrical signal is an alternating voltage signal $U_1$ (t). In an electrode arranged at a distance from the workpiece the first alternating electrical signal creates a second alternating electrical signal which is detected with a measurement electrode which has a distance from the workpiece. The second alternating signal, for instance an alternating current signal $I_{1,\varphi}$ (t), and the first alternating signal $U_1$ (t) are present as measurement signal at a phase discriminator which outputs a phase shift signal from which the phase shift of both signal s can be derived. It has been found that the phase shift depends on the capacitance formed by the measurement electrode and the workpiece, which at a constant distance of measurement electrode and workpiece is predominantly determined by the dielectric constant of the dielectric.

Since prior to the through cut, plasma forms in the interspace between measurement electrode and workpiece, the composition of the dielectric changes and thus the capacitance formed by measurement electrode and workpiece. Due to the changed capacitance the phase shift signal is changed. When the through cut has been made, the plasma capsule disappears and the phase shift signal is constant. The electronic circuit is therefore configured such that it monitors the temporal evolution of the phase shift signal and evaluates it as an indicator of the through cut made if the phase shift signal is during a predetermined time interval within the fluctuation range, which is also predetermined.

The measurement electrode is positioned close to the cutting process proper, which has an advantageous impact on the signal/noise ratio. The apparatus is particularly designed for performing the method according to the invention, so that the relevant explanations also apply to the apparatus according to the invention.

BRIEF DESCRIPTION OF THE DRAWINGS

The invention will now be described in more detail with reference to embodiments and a drawing. In detail.

DETAILED DESCRIPTION

Figure 1:
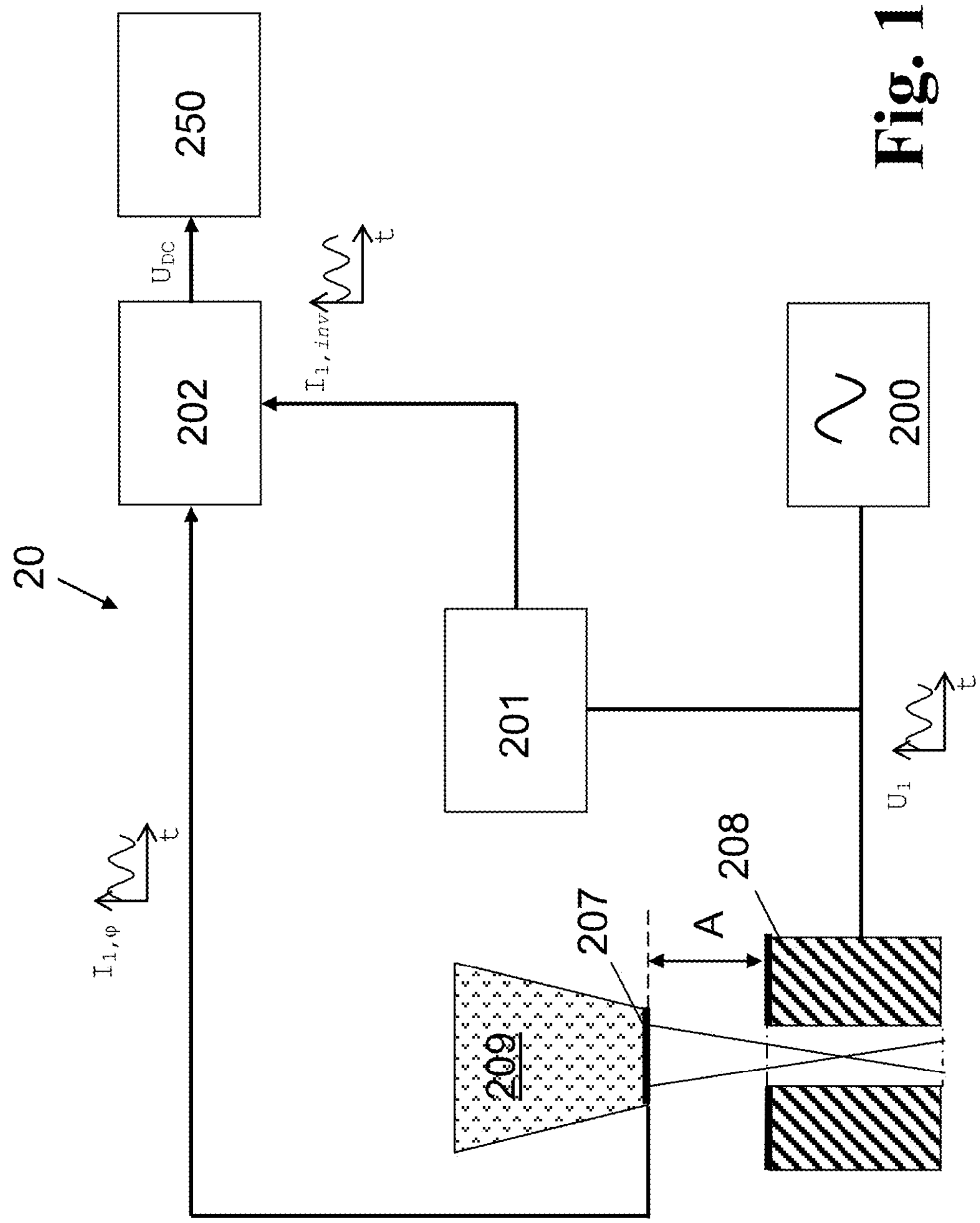
FIG. 1 shows a set-up of an apparatus according to the invention for through-cut detection.

On the whole, reference numeral 20 is assigned to the apparatus schematically shown in FIG. 1 for through-cut detection. The apparatus 20 comprises an alternating signal generator 200, a measurement electrode 207, an inverter 201, a phase discriminator 202, and an electronic circuit 250 which is designed for detecting a through-cut made.

The apparatus 20 is part of a laser cutting machine and is used in the thermal treatment of a workpiece 208 for monitoring a through-cut process into the workpiece 208 and for controlling the laser cutting machine during the through-cutting operation. The laser cutting machine comprises a movable laser treatment unit (not shown) with a laser cutting head 209 which has the measurement electrode 207 fastened thereto. For the setting of a predetermined distance of the laser cutting head 209 relative to the workpiece surface a height sensor system (not shown) is provided that defines the position of the laser cutting head 209 and thus of the measurement electrode 207.

The method according to the invention will now be explained with reference to the described laser cutting machine.

Before the beginning of a through-cutting process the measurement electrode 207 is positioned in a first step above the workpiece 208 such that the workpiece surface and the measurement electrode 207 have approximately a distance from each other that corresponds to the presumable later work distance during the through-cutting process.

The alternating electrical signal generator 200 produces an alternating voltage signal $U_1$ (t) which is present at the workpiece 208. This alternating voltage signal $U_1$ (t) and its electrical field have the consequence that a second alternating signal, namely the alternating current signal $I_{1,\varphi}$ (t), is produced in the measurement electrode 207. Both alternating signal s $U_1$ (t) and $I_{1,\varphi}$ (t) have the same time periods, but differ in the phase, wherein the alternating current signal $I_{1,\varphi}$ (t) is phase-shifted by the angle $\varphi$ relative to the first alternating voltage signal $U_1$ (t). The magnitude of the phase shift depends inter alia on the distance of the measurement electrode 207 from the workpiece 208.

Subsequently, in a second step an initial value is determined for the phase shift on the basis of the current measurement signal s. This value will be called "initial phase-shift signal value" in the following. For the determination of the initial phase-shift signal value the reference signal $U_1$ (t) is first inverted by means of the inverter 201, i.e. phase-rotated by 180°. The inverter 201 supplies a phase-rotated alternating current signal $I_{1,inv}$ (t) as the output signal.

Both the phase-rotated alternating current signal $I_{1,inv}$ (t) and the phase-shifted alternating current signal $I_{1,\varphi}$ (t) are present as input signal s at the phase discriminator 202. If the alternating current signal $s_{1,\varphi}$ (t) and $I_{1,inv}$ (t) are not phase-shifted relative to each other, these will fully offset one another at the same amplitude level. In the case of a phase shift, however, depending on whether $I_{1,\varphi}$ (t) $I_{1,inv}$ (t) is leading or trailing, one obtains a positive or negative phase shift signal which is present as an output signal of the phase discriminator 202, here in the form of a direct voltage signal $U_{DC}$. The amount of the signal is a measure of the phase angle $\Delta\varphi$ in which the phases of the signal s $I_{1,\varphi}$ (t) $I_{1,inv}$ (t) differ. To allow a simple comparison of the signal s $I_{1,\varphi}$ (t) $I_{1,inv}$ (t), at least one of the signal s present at the phase discriminator 202 is optionally pre-amplified to adapt the amplitude level of both signal s $I_{1,\varphi}$ (t) $I_{1,inv}$ (t) to each other.

The initial phase-shift signal value determined in this way is stored by the electronic circuit 250 and then used, in consideration of a tolerance value, for the definition of the predetermined fluctuation range which is used for the subsequent workpiece through-cut detection. The height sensor system of the machine control is here deactivated, so that the distance between measurement electrode 207 and workpiece 208 remains constant.

After detection of the initial phase-shift signal value, the through-cutting process is started. An energy input in the form of laser radiation into the workpiece area of the later through-cut is here carried out. The laser radiation is focused in the laser cutting head. Due to the energy input into the workpiece 208 this workpiece is fused in the area of the later through-cut. A plasma capsule of electrically charged particles is here formed on the upper side of the workpiece 208. This plasma capsule causes a change in the capacitance between measurement electrode 207 and upper side of the workpiece 208. Moreover, the distance of workpiece 208 from the measurement electrode 207 is changing, and detached workpiece parts may be accelerated in the direction of the measurement electrode 207. All of this contributes to the fact that the phase shift of the signal $I_{1,\varphi}$ (t) is constantly changing in relation to the reference signal $I_{1,inv}$ (t) during the through-cutting operation. Since the capacitance between measurement electrode 207 and upper side of the workpiece 208 changes due to the changing plasma over time, a strongly varying phase shift signal $U_{DC}$ is obtained during the through-cutting process as an output signal of the phase discriminator 207.

As soon as a through-cut through the workpiece 208 has been carried out, the plasma capsule disappears, whereby the phase shift signal changes suddenly into an almost constant signal value. The substantially constant signal value of the phase shift signal after the through-cut corresponds substantially to the initial phase-shift signal value, so that on the basis of the phase shift signal and its evolution a through cut can be reliably detected both on the basis of the constancy of the value and on the basis of its amount. To this end the temporal evolution of the phase shift signal is detected by the electronic circuit 250 in a time interval and evaluated. The electronic circuit 250 is designed for this purpose such that when in a time interval of 200 ms, which is evaluated by the electronic circuit, the phase shift signal is within the predetermined fluctuation range of +10% around the initial phase-shift signal value, a performed through-cut is detected.

If this is the case, the electronic circuit 250 outputs for instance an optical and/or acoustic indication signal, and it then starts, based on the through cut, the cutting process, or it ends the through-cutting process.

Figure 2:
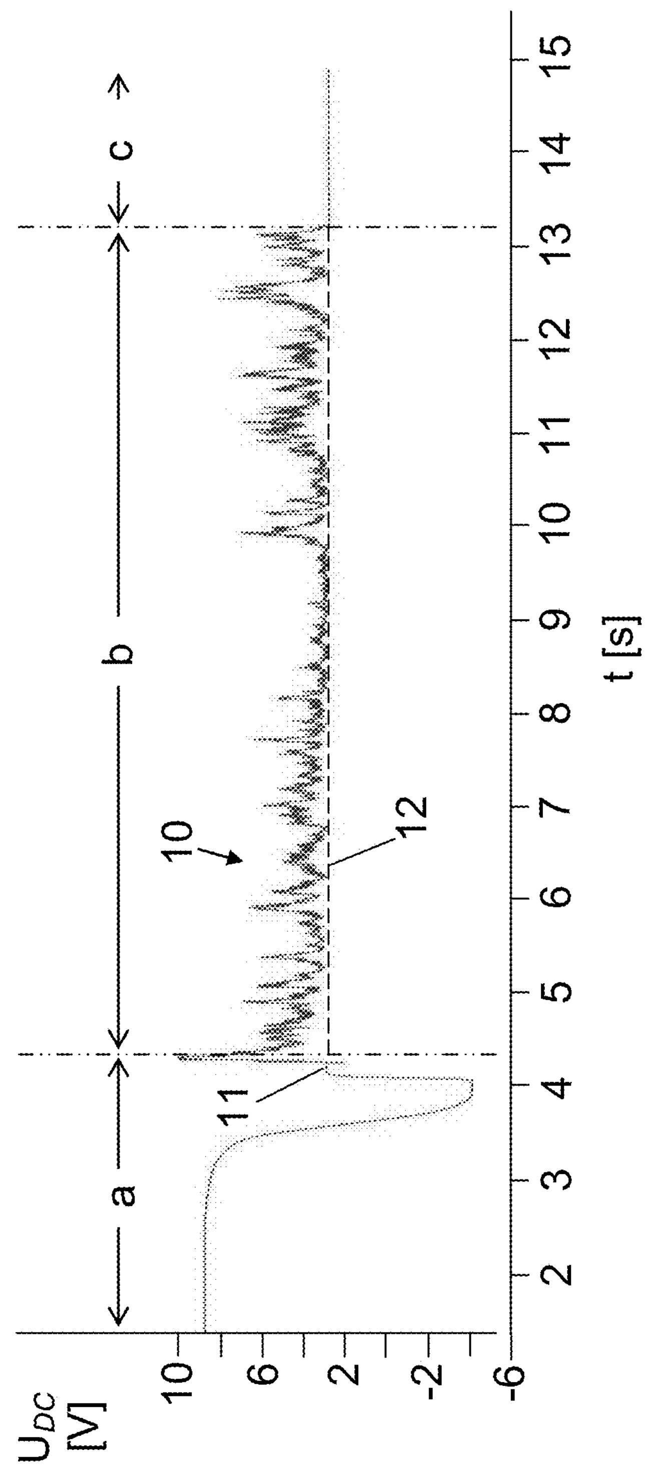
FIG. 2 shows a first diagram, in which a phase shift signal is illustrated as a function of time.

FIG. 2 shows by way of example a typical time curve t (in seconds) of a phase-shift voltage signal $U_{DC}$ (in V) during through-cutting through a solid material of high-grade steel with a material thickness of 10 mm by using the apparatus of FIG. 1.

On the whole, reference signal 10 is assigned to the signal curve. In the illustration of FIG. 2 the signal curve is subdivided into plural sections a, b, c. Section a marks the signal section that corresponds to the movement of the measurement electrode 207 to the initially estimated work height. When the measurement electrode 207 has reached this work height, the apparatus will provide a constant phase-shift signal value which is detected by the electronic circuit 250 as initial phase-shift signal value. In signal curve 10 this constant signal value is designated by reference numeral 11.

Section b of the signal curve 10 represents the through-cutting process. Particularly due to the coupling-in of high electrical power a plasma capsule is formed on the upper side of the workpiece, the plasma capsule being accompanied by capacitance fluctuations and a varying phase-shift signal with high noise.

After the through cut has been made (section c), the phase shift signal decreases noticeably and the noise disappears, so that a stable phase-shift signal which is approximately constant in time is detected.

The through cut is thus noticeable due to the fact that the phase shift signal 10 has a small fluctuation range, i.e. it is in a time interval in a predetermined time interval within a predetermined fluctuation range, and that it declines to the initial phase-shift signal value 11. Taken together, both criteria allow a comparatively fast and reliable statement on the through cut.

For the specification of the fluctuation range the previously determined initial phase-shift signal value is used. Said value is illustrated in FIG. 2 by the broken line 12 and gives a good approximation for the target value to be expected. In the embodiment the predetermined fluctuation range is ±10% around the initial phase-shift signal value.

Figure 3:
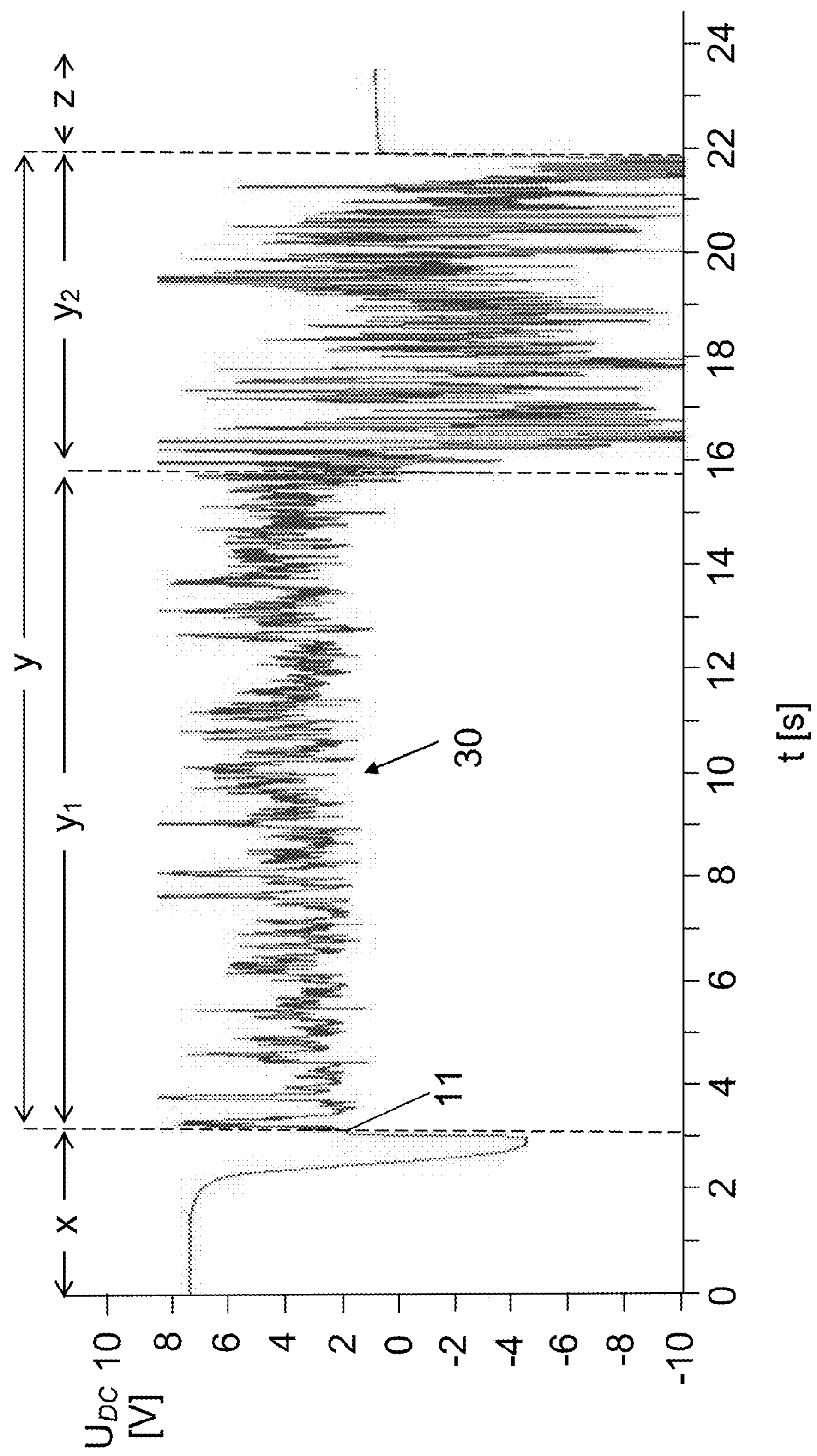
FIG. 3 shows a second diagram, in which a phase shift signal is illustrated as a function of time.

FIG. 3 shows another time curve 30 t (in seconds) of the phase-shift voltage signal $U_{DC}$ (in V), as has been measured during the through-cutting of a solid material of high-grade steel with a material thickness of 15 mm.

The measurement electrode (207) and the laser cutting head were here initially held at a fixed position relative to the workpiece surface, namely at a work distance of about 3.5 mm. The time curve 30 of the phase-shift voltage signal $U_{DC}$ reveals three sections x, y, z, which will be described in detail hereinafter.

Section x (corresponding to the phase section a in the diagram of FIG. 2) shows the phase shift signal as obtained in the movement of the measurement electrode and the laser cutting head to the work height. The signal curve in section x correlates with the distance changes of the measurement electrode relative to the workpiece surface.

As soon as the work height and the constant signal value 11 have been reached, the energy input into a through-cut area of the workpiece is started. A pulsed laser is used for this with 4 kW power at 25% duty cycle and a pulse frequency of 70 Hz.

Due to the energy input a plasma capsule is formed on the workpiece surface. As has already been described with respect to FIG. 2, this leads to a varying phase-shift signal with high background noise.

However, a look at section y in its entirety reveals that the phase shift signal shows a drift towards lower voltages in the course of time. Specifically, two sub-areas $y_1$, $y_2$ can be seen that differ in their phase-shift mean value. In sub-area y1 plasma formation substantially takes place on the workpiece surface. With time, however, an increasing material fusion is observed in the through-cut area, accompanied by a spatial shift of the plasma formation and the plasma capsule towards the middle of the workpiece. This changes the influence of the plasma capsule on the phase shift signal, so that the signal shifts towards lower voltages (area $y_2$). This phenomenon is particularly strongly noticed in workpieces with rather great material thicknesses, normally at material thicknesses above 10 mm.

The change of the phase shift signal in area $y_2$ can advantageously be used for the control of the laser. Due to the fact that in the course of the through-cutting process the plasma capsule spatially shifts towards the middle of the workpiece, it is possible upon occurrence of rather great phase-shift signal fluctuations and/or a phase shift signal drift to adapt the performance parameters of the laser or preferably to change the control of the laser such that the focal position of the laser follows the changed plasma position. This can for instance be done a) by reducing the work height, or b) preferably, by changing the focal position, for instance by shifting the focal position towards the bottom side of the workpiece.

Alternatively, it is also possible to change the power of the laser, its pulse frequency, duty cycle or the gas pressure.

The above-mentioned measures help to achieve a particularly high through-cut quality.

For the explanation of the method for through-cut detection, FIGS. 4A-4E show an arrangement of workpiece and apparatus for through-cut detection in time sequence before, during and after a through-cutting operation.

Figure 4C:
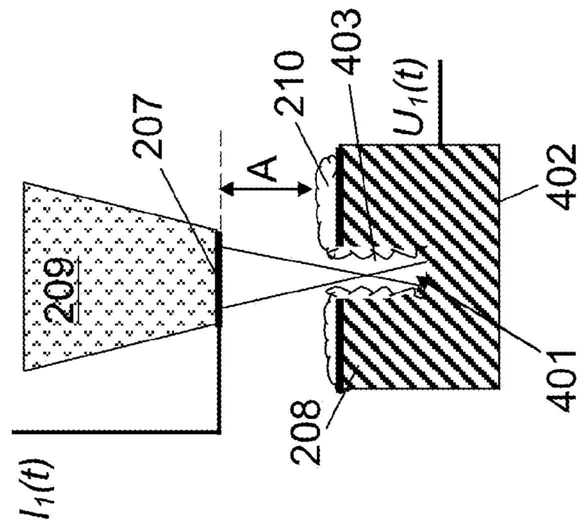
FIGS. 4A to 4E show, for the explanation of the method for through-cut detection, an arrangement of workpiece and apparatus for through-cut detection in time sequence before, during and after a through cut.
Figure 4B:
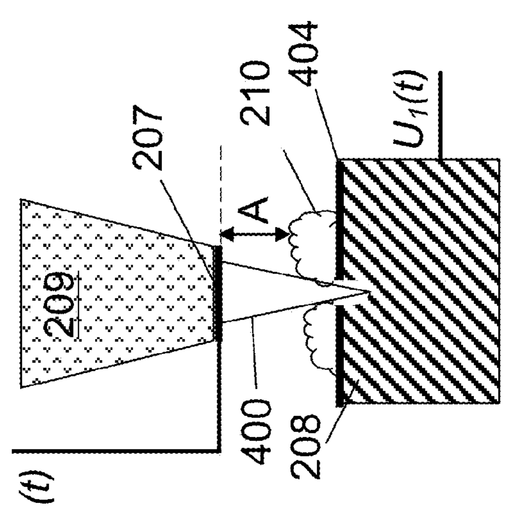
Figure 4A:
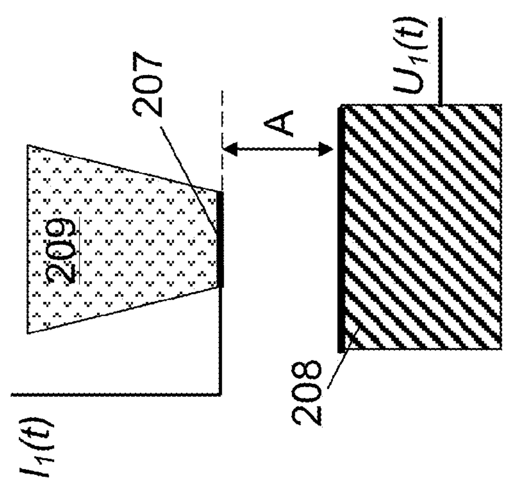

FIG. 4A shows an arrangement of workpiece 208 and a laser cutting head 209 on which a measurement electrode 207 is mounted. The arrangement in FIG. 4A detects the initial phase-shift signal value. To this end the laser cutting head 209 is located at work height; an energy input into the workpiece does not take place.

An alternating voltage signal $U_1$ (t) which in the measurement electrode 207 produces a phase-shifted second alternating signal, namely the alternating current signal (t), is applied at workpiece 208. The initial phase-shift signal value is determined based on both alternating signal s $U_1$ (t) and $I_{1,\varphi}$ (t).

FIG. 4B shows the same arrangement during an energy input by way of laser radiation 400 into the workpiece 208. A plasma capsule 210 has formed on the upper side 404 of the workpiece 208. The plasma capsule 210 has an influence on the phase shift of the alternating signal s $U_1$ (t) and $I_{1,\varphi}$ (t) and thus on the phase shift signal. The phase shift signal as a measure of distance A shows some noise during this method step, as is e.g. shown in FIG. 2, section b, or in FIG. 3, section y.

As shown in FIG. 4C, an incision 403 into the workpiece 208 is increasingly formed during the through-cutting process. The cutting point 401 shifts away from the measurement electrode 207 towards the bottom side 402 of the workpiece. At the same time the height with which the plasma capsule 210 projects over the upper side 404 of the workpiece 208 is decreasing; the apparent distance A becomes greater again. This process is accompanied by a drift of the phase shift signal. Such a drift can for instance be seen in the phase shift signal 30 of FIG. 3, section $y_2$. If a drift is detected in the phase shift signal, this can be used as a basis for a new focusing of the laser.

Figure 4E:
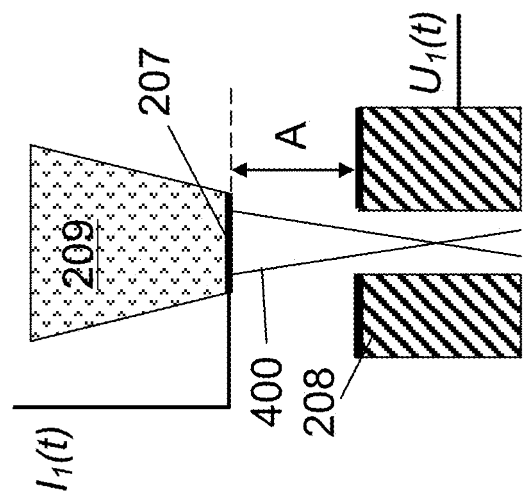
Figure 4D:
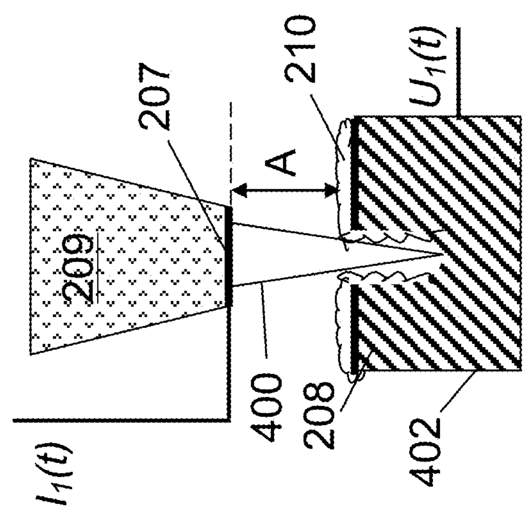

FIG. 4D shows the arrangement of FIG. 4C in which the focal position of the laser beam 400 is shifted towards the bottom side 402 of the workpiece. Such an adaptation of the focal position has the advantage that a particularly high cutting quality is obtained.

FIG. 4E shows a through cut. The laser beam 400 passes through the workpiece in the area of the through cut unimpededly.

Figure 5:
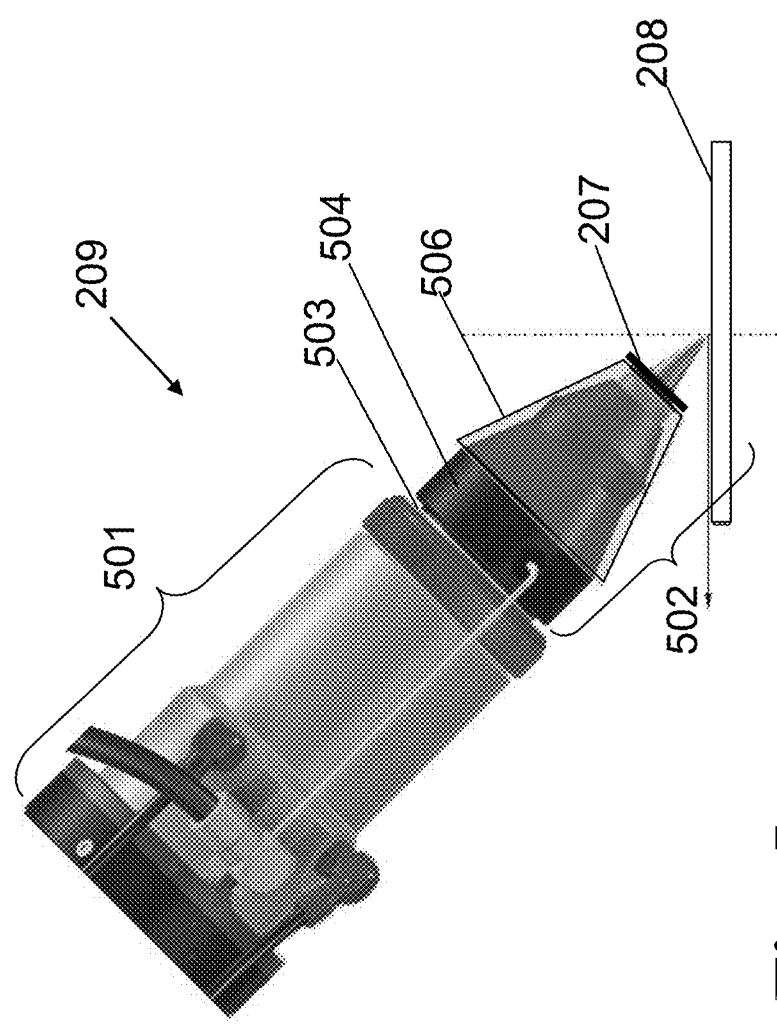
FIG. 5 shows a laser cutting head with an apparatus according to the invention for through-cut detection and a shielding element.

FIG. 5 shows the laser cutting head 209 in more detail. The laser cutting head 209 is subdivided into an upper part 501 and a lower part 502. The upper part 501 is connected to the mass of a laser cutting machine (not shown). The lower part 502 comprises a cutting nozzle 504 and the measurement electrode 207 mounted thereon. If an alternating voltage is present at a workpiece 208, said voltage produces a phase-shifted alternating signal in the measurement electrode 207. Since the upper part of the laser cutting head 209 is connected to the mass of the laser cutting machine, it is necessary that the upper part 501 and the lower part 502 of the laser cutting head 209 should be electrically separated from each other by an insulator 503.

The accuracy of the detected phase-shift signal may be impaired by irregularities of the workpiece 208 or by parasitic capacitances. Irregularities in this sense may for instance be caused by the workpiece edge, the workpiece shape or cutouts from the workpiece. Parasitic capacitances may be due for instance to the chamfer position of the laser cutting head 209 during the through-cutting process and the associated approach of the laser cutting head 209 to the workpiece 208. These effects may impair the accurate detection of a workpiece through-cut.

To minimize such influences on the measurement result, here the phase shift signal, the laser cutting head 209 is provided with a shielding element 506. The shielding element 506 is designed as a shield electrode and assigned to the cutting nozzle 504. It is conical and surrounds the cutting nozzle 504 along its lateral surfaces. This has the advantage that the laser cutting head 209 can also be arranged above inner contours that have already been cut, or near the workpiece edge, without the measurement result being impaired considerably. Moreover, the position of the laser cutting head 209 relative to the workpiece 208 can be changed during the through-cutting operation without substantially impairing the detection of the through cut.

The above-described apparatus according to the invention can simultaneously be used for detecting a cut break-off. For instance, a cutting operation directly follows the through-cutting operation. In this case the apparatus can be used as a cut break-off detection apparatus.

Figures 6, 7:
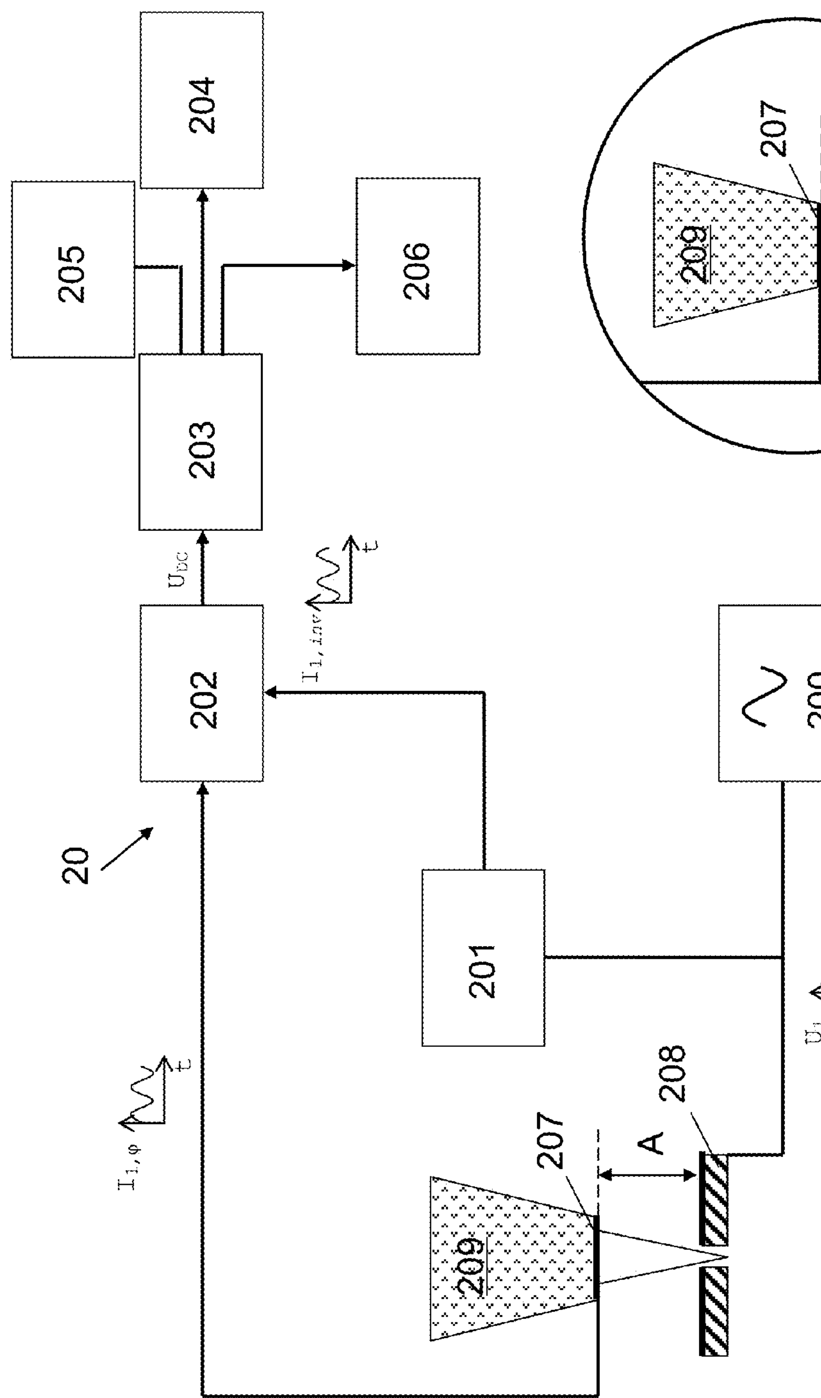
FIG. 6 shows a schematic diagram of an apparatus according to the invention for through-cut detection, which can also be used for cut break-off detection.
FIG. 7 shows a cutout from the diagram of FIG. 6 in case of a cut break-off.

FIG. 6 shows a schematic diagram of an apparatus 20 according to the invention of FIG. 1, which can be used as a cut break-off detection apparatus.

The apparatus 20 comprises an alternating signal generator 200, a measurement electrode 207, an inverter 201, a phase discriminator 202, a control unit 203 and three independent electronic circuits 204, 205, 206.

The apparatus 20 is part of a laser cutting machine (not shown), as is e.g. used for cutting a flat workpiece 208 of metal, preferably of high-grade steel, aluminum, copper or brass.

The cut break-off detection method will be explained hereinafter with reference to the above-described laser cutting machine.

First of all the workpiece 208 is subjected to an alternating voltage signal $U_1$ (t). To this end the alternating signal generator 200 produces the alternating voltage signal $U_1$ (t) which is applied to the workpiece 208 and is subsequently used as a reference signal.

The alternating voltage signal $U_1$ (t) produces an alternating current signal $I_{1,\varphi}$ (t) in measurement electrode 207. Both alternating signal s $U_1$ (t) and $I_{1,\varphi}$ (t) have the same time periods, but differ in the phase, with the alternating current signal $I_{1,\varphi}$ (t) being phase-shifted by the angle $\varphi$ relative to the first alternating voltage signal $U_1$ (t). The magnitude of the phase shift depends inter alia on the distance of the measurement electrode 207 from the workpiece 208. The alternating current signal $I_{1,\varphi}$ (t) is detected by means of the measurement electrode 207.

Under normal cutting conditions the distance between measurement electrode 207 and workpiece 208 is kept as constant as possible, apart from control deviations, by the height sensor system. Although the alternating current signal $I_{1,\varphi}$ (t) resulting therefrom shows some noise, it has a phase shift almost constant in time relative to the reference signal $U_1$ (t).

For the determination of the phase shift, the reference signal $U_1$ (t) is first of all inverted by means of the inverter 207, i.e. phase-rotated by 180°. The inverter 201 supplies a phase-rotated alternating current signal $I_{1,inv}$ (t) as the output signal.

Both the phase-rotated alternating current signal $I_{1,inv}$ (t) and the phase-shifted alternating current signal $I_{1,\varphi}$ (t) are present at the phase discriminator 202 as input signal s. The phase discriminator 202 also includes a rectifier. If the alternating current signal s $I_{1,\varphi}$ (t) and $I_{1,inv}$ (t) are not phase-shifted with respect to each other, these will fully neutralize each other at the same amplitude level. In the case of a phase shift, however, depending on whether $I_{1,\varphi}$ (t) $I_{1,inv}$ (t) is leading or trailing, one obtains a positive or negative phase shift signal in the form of the direct-voltage signal $U_{DC}$. The amount of the signal is a measure of the phase angle $\Delta\varphi$ in which the phases of the signal s differ. To allow a simple comparison of the signal s, at least one of the signal s at the phase discriminator 202 is optionally pre-amplified (not shown) to adapt the amplitude levels of the two signal s to each other.

Subsequently, the phase shift signal $U_{DC}$ is compared by the control unit 203 with a predetermined upper and lower limit value.

During the normal cutting operation the limit values are normally not exceeded or fallen short of. However, in the event of a cut break-off, a plasma capsule 210 is formed on the upper side of the workpiece 208. This plasma capsule 201 is mainly created by the coupling-in of high power peaks into the workpiece 208.

FIG. 7 shows the laser cutting head 209, the workpiece 208 and the plasma capsule 210 in the event of a cut break-off. The evolving plasma capsule 210 causes a change in the capacitance between measurement electrode 207 and upper side of the workpiece 208. Moreover, detached workpiece parts are accelerated due to the kerf, which no longer penetrates the material, towards the nozzle and the measurement electrode 207, respectively. This results in a changed phase shift of signal s $I_{1,\varphi}$ (t) and $I_{1,inv}$ (t). Since the capacitance between measurement electrode 207 and upper side of the workpiece 208 changes and varies due to the variable plasma over time, a varying phase-shift signal $U_{DC}$ which is used for the detection of the cut break-off is also obtained as the output signal of the phase discriminator 202. To this end the phase shift signal is monitored by the control unit 203 as to whether it exceeds or falls below an upper or lower limit. In the event that a respective limit value is exceeded or not reached, the separation speed is reduced by means of the electronic circuit 204, the measurement electrode is set by means of the electronic circuit 205 to a predetermined fixed position, and an optical and acoustic alarm signal is sent by means of the electronic circuit 206.

Figure 8:
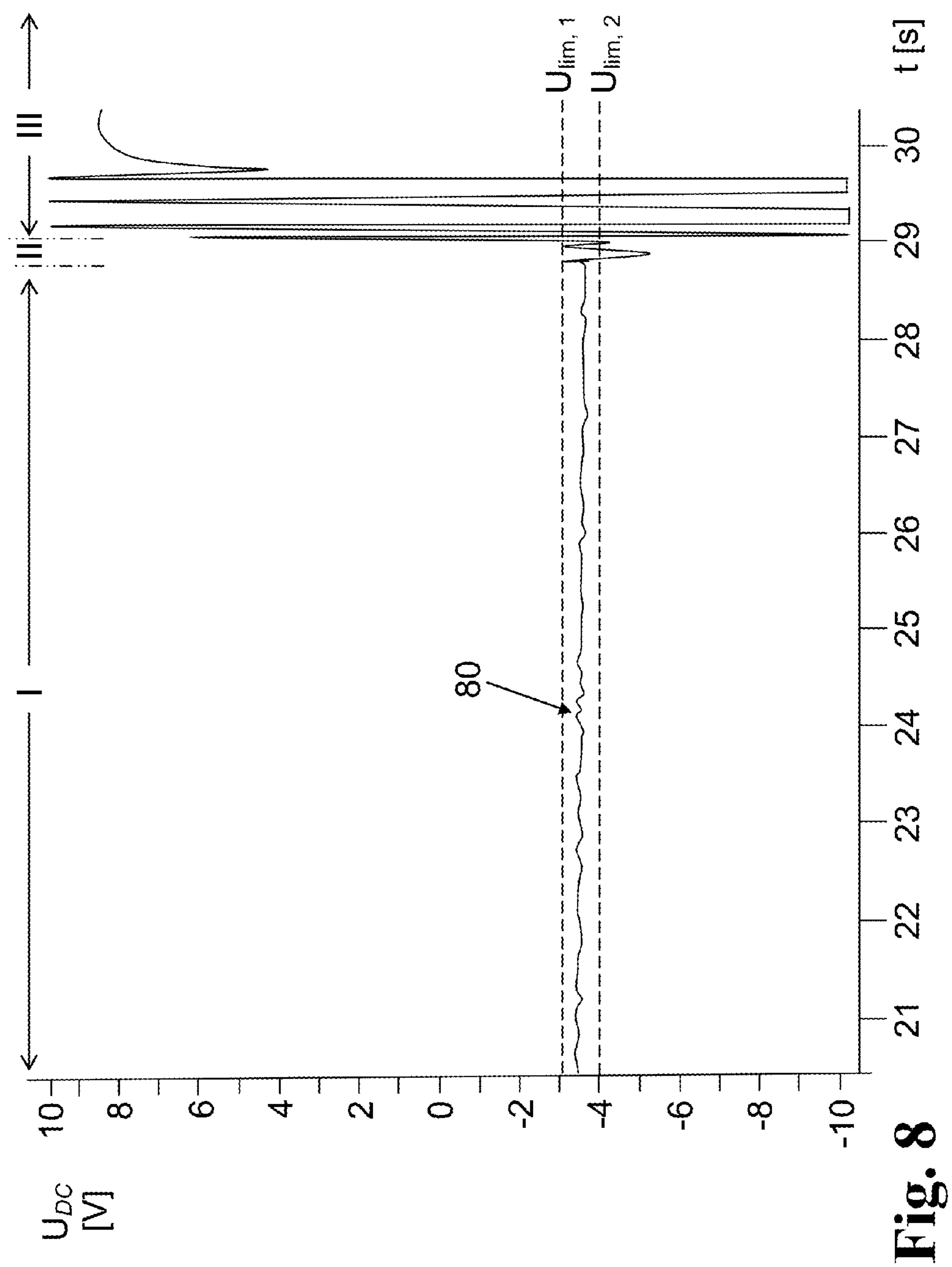
FIG. 8 shows a diagram in which a phase-shift direct-voltage signal is illustrated during a cutting operation as a function of time.

FIG. 8 shows by way of example a temporal evolution of the phase-shift voltage signal $U_{DC}$ for a good cut (section I), an imminent cut break-off (section II) and after the cut break-off has taken place (section III). The phase shift signal is marked with reference numeral 80.

Prior to the cut break-off, phase shift signal 80 exhibits noise that is standard during the cutting operation. Nevertheless, the phase shift signal 1 in section I is substantially constant and varies around a mean value with only a small deviation. An imminent cut break-off leads to an amplification of the phase shift signal 80 in section II up to maximum deflection in section III.

To successfully counteract an imminent cut break-off and thereby to avoid a cut break-off, it is important to detect a beginning cut break-off as early as possible. The use of the phase shift signal allows early cut break-off detection particularly in section II. The upper limit value $U_{lim,1}$ and the lower limit value $U_{lim,2}$ are chosen such that they allow early detection.

The invention claimed is:

1. A method for through-cut detection in thermally-assisted through cutting of a workpiece, said method comprising:

subjecting the workpiece to a first alternating electrical signal, detecting a second alternating electrical signal caused by the first alternating electrical signal in a measurement electrode spaced from the workpiece, determining a phase shift between the first and second alternating electrical signal so as to produce output of a phase shift signal, performing a thermally-assisted cutting operation on the workpiece, detecting a progression over time of the phase shift signal or a measurement variable derived therefrom in a predetermined time interval, determining that a workpiece through-cut has been made responsive to the phase shift signal or the measurement variable derived therefrom being within a predetermined fluctuation range in the predetermined time interval, and changing a condition of the thermally-assisted cutting operation responsive to a determination that the workpiece through-cut has been made.

2. The method according to claim 1, wherein the measurement electrode is kept at a constant work distance from the workpiece during the thermally assisted through-cutting operation.

3. The method according to claim 2, wherein prior to the thermal through-cut with the measurement electrode kept at the work distance, an initial phase-shift signal value is determined, and wherein the initial phase-shift signal value is in the predetermined fluctuation range.

4. The method according to claim 3, wherein the predetermined fluctuation range has a mean value corresponding to the initial phase-shift signal value, and wherein the predetermined fluctuation range is in a range of ±5% to ±15% based on the mean value.

5. The method according to claim 1, wherein, the detecting of the progression over time is of the measurement value derived from the phase shift signal, and said measurement signal is derived as a variance of the phase shift signal in the predetermined time interval.

6. The method according to claim 1, wherein, in the detecting of the progression over time is of the measurement value derived from the phase shift signal, and said measurement signal is derived as a first time derivative of the phase shift signal in the predetermined time interval.

7. The method according to claim 1, wherein the thermally assisted through-cutting of the workpiece is done using a treatment unit, and an energy input is made into an incision crater, and the through-cutting operation is monitored such that when the progression over time detected in the predetermined time interval exceeds a predetermined maximum fluctuation range or when in the progression over time a peak value is detected above a predetermined peak maximum value, the energy input into the incision crater is changed.

8. The method according to claim 7, wherein the treatment unit comprises a laser, and the energy input into the incision crater is changed by changing a focal position, pulse frequency, power and/or duty cycle of the laser.

9. The method according to claim 7, wherein the treatment unit comprises a cutting torch, and the energy input into the incision crater is changed by changing gas pressure of said cutting torch.

10. An apparatus for through-cut detection in the thermally assisted through-cutting of a workpiece, said apparatus comprising:

a thermally assisted through-cutting device configured to act upon the workpiece;

an alternating signal electrical signal generator generating a first alternating signal, a measurement electrode spaced from the workpiece and detecting a second alternating signal electrical signal caused by the first alternating signal, a phase discriminator determining a phase shift between the first and the second alternating signal, wherein said discriminator outputs a phase shift signal, and an electronic circuit detecting a progression over time of the phase shift signal or of a measurement variable derived therefrom, said electronic circuit being configured so as to identify a workpiece through-cut responsive to the phase shift signal or the measurement variable derived therefrom being within a predetermined fluctuation range in a predetermined time interval, and to change a condition of the thermally assisted through-cutting device when the workpiece through-cut is identified.

11. The apparatus according to claim 10, wherein the apparatus supports the measurement electrode at a constant work distance from the workpiece during the thermally assisted through-cutting operation.

12. The apparatus according to claim 10, wherein said electronic circuit detects progression over time of the derived measurement variable by deriving a variance of the phase shift signal in the predetermined time interval.

13. The apparatus according to claim 10, wherein said electronic circuit detects progression over time of the derived measurement variable by deriving a first time derivative of the phase shift signal in the predetermined time interval.

14. The apparatus according to claim 10, wherein and further comprising a treatment unit thermally assisting the through-cutting of the workpiece, wherein an energy input is made into an incision crater, and the through-cutting operation is monitored such that, when the progression over time detected in the predetermined time interval exceeds a predetermined maximum fluctuation range, or when in the progression over time a peak value is detected above a predetermined peak maximum value, the energy input into the incision crater is changed.

15. The apparatus according to claim 14, wherein the treatment unit comprises a laser, and the energy input into the incision crater is changed by changing a focal position, pulse frequency, power and/or duty cycle of the laser.

16. The apparatus according to claim 14, wherein the treatment unit comprises a cutting torch, and the energy input into the incision crater is changed by changing gas pressure of said cutting torch.

* * * * *